United States Patent [19]

Ohshima et al.

[11] Patent Number: 4,766,086

[45] Date of Patent: Aug. 23, 1988

[54] METHOD OF GETTERING A SEMICONDUCTOR DEVICE AND FORMING AN ISOLATION REGION THEREIN

[75] Inventors: Jiro Ohshima; Shin-ichi Taka, both of Kawasaki; Toshiyo Ito, Yokohama; Masaharu Aoyama, Fujisawa, all of Japan

[73] Assignee: Kabushiki Kaisha Toshiba, Kawasaki, Japan

[21] Appl. No.: 20,758

[22] Filed: Mar. 2, 1987

[30] Foreign Application Priority Data

Mar. 7, 1986 [JP] Japan ................................. 61-49912

[51] Int. Cl.$^4$ .................. H01L 21/265; H01L 21/225
[52] U.S. Cl. ......................... 437/011; 148/DIG. 24; 357/34; 357/91; 437/18; 437/31; 437/968
[58] Field of Search ............... 437/11, 18, 31; 357/34, 357/91

[56] References Cited

U.S. PATENT DOCUMENTS

| | | | |
|---|---|---|---|
| 3,874,936 | 4/1975 | d'Hervilly et al. | 437/11 |
| 4,063,967 | 12/1977 | Graul et al. | 148/1.5 |
| 4,063,973 | 12/1977 | Kirita et al. | 148/188 |
| 4,133,704 | 1/1979 | MacIver et al. | 437/11 |
| 4,322,882 | 4/1982 | Vora | 437/31 |
| 4,389,255 | 6/1983 | Chen et al. | 437/31 |
| 4,437,897 | 3/1984 | Kemlage | 437/31 |
| 4,581,319 | 4/1986 | Wieder et al. | 437/31 |
| 4,640,721 | 2/1987 | Vehara et al. | 437/31 |

Primary Examiner—Upendra Roy
Attorney, Agent, or Firm—Finnegan, Henderson, Farabow, Garrett & Dunner

[57] ABSTRACT

In a method of manufacturing a semiconductor device according to the present invention, a given position of a thermal oxide film formed on a monocrystalline silicon layer is opened to expose a surface of the monocrystalline silicon layer to serve as a getter site, a polycrystalline silicon layer is deposited on the thermal oxide film and the surface of the monocrystalline silicon layer, and the polycrystalline silicon layer is oxidized to convert the surface of the monocrystalline silicon layer directly contacting the polycrystalline silicon layer into an oxide film by thermal oxidation. That is, the position of interface between the oxide film and the monocrystalline silicon layer is shifted into the original monocrystalline silicon layer. During thermal oxidation of the polycrystalline silicon layer, a plurality of crystal defects to serve as getter sites are generated deeper than those generated by a conventional implagetter method in the monocrystalline silicon layer. In addition, the crystal defects generated in the manner described above do not extend to the surrounding region by subsequent annealing so that a region of the crystal defects is limited.

18 Claims, 3 Drawing Sheets

A BOUNDARY

A DISLOCATION LINE EXTENDED FROM ISOLATION REGION

METHOD OF GETTERING A SEMICONDUCTOR DEVICE AND FORMING AN ISOLATION REGION THEREIN

BACKGROUND OF THE INVENTION

The present invention relates to a method of manufacturing a semiconductor device and, more particularly, to an advancement in a method of improving crystallinity of an element active region to enhance an element characteristic.

An element such as a transistor for constituting a semiconductor device such as an IC (Integrated Circuit) performs a predetermined operation by migration of carriers (electrons or holes) in a semiconductor layer such as Si. Therefore, the characteristics of a semiconductor device largely depends on the crystal state in the element active region.

For example, factors which disturb crystallinity of an Si layer are dislocations, stacking faults, and heavy metals such as Fe or Cu, which are present in the lattice. Since these heavy metals form a recombination center for the carriers, if such heavy metals are present in the element active region, the element characteristics are degraded. In a bipolar transistor, it is assumed that a heavy metal present near a base region causes so-called burst noise (e.g., "Solid State Electronics", 1980, Vol. 23, pp. 1147 to 1149). It is also known that a current amplification characteristic (hFE characteristic) in a low current region is degraded when a crystal defect across a base junction is present.

For this reason, various methods have been conventionally used to improve the crystal state. Especially, a getter method is widely used to remove a heavy metal from the active region.

In the most widely used phosphorus getter method, phosphorus is doped in the rear surface of an Si wafer at a stage after element formation is completed, and high-temperature annealing is performed. The doped phosphorus enters the Si lattice to generate strain, and a force is generated in the crystal to recover an equilibrium state by subsequent annealing, thereby performing the getter effect. That is, the diffusion speed of the above heavy metal is faster than the migration speed of Si. An equilibrium state is obtained such that the heavy metal is captured at the above strain portion.

However, in the case of the phosphorus getter method, the following problems are posed in manufacturing a semiconductor device. Since the phosphorus getter method is performed after element formation, the front surface of the silicon substrate must be prevented from being doped. This requires an extra step of covering the wafer surface with a thick CVD film or the like. In addition, since the phosphorus getter method is normally performed in a POCl$_3$ diffusion furnace, an impurity such as P$_2$O$_5$ is adhered inside a diffusion tube. The impurity is adhered to the wafer, or a phosphorus mist is scattered in a clean room, thereby adversely affecting manufacture of a semiconductor device.

Furthermore, since a thin insulating film covering the silicon layer surface is formed along with micropatterning of the element in a recent semiconductor device, the phosphorus getter method requiring protection by a thick CVD film cannot be applied.

Recently, argon Ar, carbon C, oxide O, silicon Si, and the like have been ion-implanted to a part of a rear or a front surface of the wafer to damage it, thereby performing an implagetter method using the damaged layer (defect) as a getter site. In this method, the damaged layer is subsequently annealed, and the heavy metal is captured in a process of recovering the equilibrium state.

The implagetter method does not have the above-mentioned problems and can advantageously form a getter site selectively at a predetermined region on the front surface of the wafer. However, in order to form a sufficient damaged layer serving as a getter site, a dose of $1 \times 10^{15}$ /cm$^2$ or more is required and ion-implantation must be performed for a long period of time, resulting in an extremely high manufacturing cost. In addition, the getter site formed is generally shallow. For example, the getter site has a depth of 0.3 μm when silicon Si is ion-implanted at 150 keV.

Furthermore, when high-temperature annealing is performed for gettering, a crystal defect of the getter site undesirably expands to a surrounding region. For this reason, even when the getter site is formed in a region such as an isolation diffusion layer of a bipolar semiconductor device which does not adversely affect the element characteristic, the crystal defect sometimes expands to the element active region during the thermal step of gettering.

FIG. 7 is a photograph showing the case in which silicon Si is ion-implanted to the isolation diffusion region under the condition of a dose of $1 \times 10^{15}$ /cm$^2$ to perform gettering. In this photograph, a defect diffusing in an arcuated shape around the isolation region is found.

If such a crystal defect extends to the base junction, the current amplification characteristic (hFE characteristic) is degraded.

In addition, in a method described in U.S. Pat. No. 4063973, Filed: Nov. 4, 1976, a silicon oxide film as an insulating film is formed on a semiconductor substrate, an opening for forming a diffusion region on the silicon oxide film is formed to expose the semiconductor substrate, an As-doped polycrystalline silicon layer is deposited on the exposed surface of the semiconductor substrate and the silicon oxide film, an As-doped silicon oxide film is formed on the polycrystalline silicon layer, an impurity is diffused in an oxide atmosphere at a temperature of 1,100° C. for 30 minutes, and in this diffusion annealing step, a portion of the polycrystalline silicon layer is oxidized to perform impurity diffusion without damaging the surface of the silicon semiconductor substrate.

SUMMARY OF THE INVENTION

It is an object of the present invention to provide an effective getter method which is not as complex as the phosphorus getter method, which is capable of selectively forming a getter site at a predetermined region of a monocrystalline silicon layer by an extremely economical process as compared with the implagetter method, and which is free from problems such as diffusion of a crystal defect.

In the present invention, a thermal oxide film is formed on a monocrystalline silicon layer, a portion of the thermal oxide film located on a prospective formation region of a getter site to be formed in the monocrystalline silicon layer is opened and the monocrystalline silicon surface is exposed only at this opening, a polycrystalline silicon layer is formed on the exposed portion of the monocrystalline silicon and the thermal oxide film, the polycrystalline silicon layer is thermally oxidized so as to be entirely converted to an oxide film, and in this step of oxidizing the polycrystalline silicon layer, a surface of the monocrystalline silicon layer directly contacting the polycrystalline silicon layer is oxidized to a certain depth.

The gettering effect in the present invention has the following two features.

First, unlike the case in which the exposed surface of the monocrystalline silicon is directly thermally oxidized, when the polycrystalline silicon layer is formed on the monocrystalline silicon layer and the polycrystalline silicon layer is thermally oxidized first and then the monocrystalline silicon layer is oxidized, a plurality of crystal defects serving as getter sites are generated in the monocrystalline silicon layer. In addition, it is found that the crystal defects serving as the getter sites are formed deeper than those formed by the implagetter method, wherein that surface portion of the crystal which has been damaged is used as a getter site. A mechanism of generating the above-mentioned crystal defects is not apparent yet. However, one possible explanation is a mechanism in which intergranular boundaries between fine particles of monocrystalline silicon constituting the polycrystalline silicon layer are transferred to the monocrystalline silicon layer when thermal oxidation progresses from the polycrystalline to the monocrystalline layer.

In either case, the crystal defects formed during the above-described thermal oxidation in the present invention allow effective gettering which cannot be performed by the conventional gettering method.

Second, unlike in the conventional implagetter method, the crystal defects formed by the above method do not extend to the surrounding region in a subsequent annealing step, and hence the region with the crystal defects is limited. Although this fact is also an unexpected result, the cause can be assumed to be as follows.

In the conventional implagetter method, a crystal defect is formed by ion-implantation, and gettering is performed during a process in which a crystal system as a whole reaches a thermodynamic equilibrium by subsequent annealing. Therefore, the strain energy of the crystal defect is released to the surrounding region to expand the defect region.

On the contrary, according to the present invention, formation of the crystal defect and gettering advance simultaneously during annealing for oxidizing the polycrystalline silicon layer.

Therefore, both the formation of the getter site and gettering are performed under the condition in which a thermal equilibrium is maintained. The crystal defect capturing the heavy metal reaches a thermodynamic equilibrium and is stabilized in the entire crystal defect system. Therefore, it is assumed that the crystal defect can no longer extend to the surrounding region.

BRIEF DESCRIPTION OF THE DRAWINGS

FIGS. 1 to 4 are sectional views for explaining an embodiment of a method of manufacturing a semiconductor device according to the present invention in the order of manufacturing steps when the method is applied to the manufacture of a bipolar semiconductor device, in which:

FIG. 1 is a sectional view of a step in which a thermal oxide film is formed on an n-type silicon layer formed on a p-type silicon substrate, an opening is formed at a prospective formation region for an isolation diffusion region of the thermal oxide film, a polycrystalline silicon layer is formed on the entire front and rear surfaces of the wafer, and then boron fluoride is ion-implanted in the polycrystalline silicon layer of the wafer's front surface;

FIG. 2 is a sectional view of a step in which an $SiO_2$ film is deposited on the polycrystalline silicon layer of the wafer's front surface, and then an impurity implanted in the polycrystalline silicon layer is diffused to form an isolation diffusion region by annealing;

FIG. 3 is a sectional view of a step in which the $SiO_2$ film is removed, the polycrystalline silicon layers of the front and rear surfaces of the wafer are converted to oxide films, at that time a surface of a monocrystalline silicon layer is oxidized slightly at a portion where the polycrystalline and monocrystalline silicon layer directly contact each other;

FIG. 4 is a sectional view of a step in which the oxide film is removed, and an NPN transistor is formed in an element region in accordance with a conventional process of manufacturing a bipolar semiconductor device;

DETAILED DESCRIPTION OF THE PREFERRED EMBODIMENT

Figure 1:
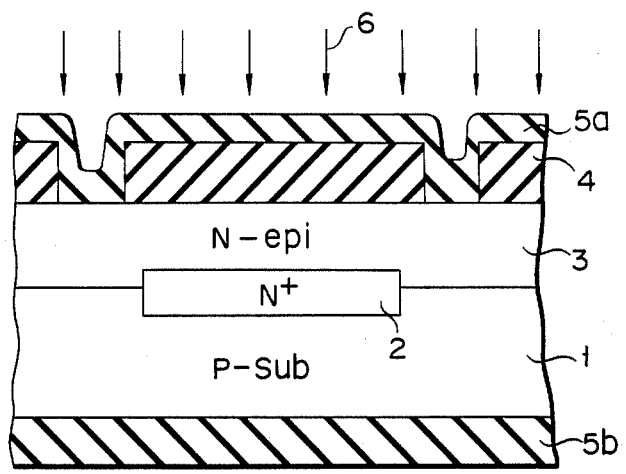

A preferred embodiment of the present invention when applied to the manufacture of a bipolar semiconductor device will be described below.

(1) First, using Miller indices (111) of p-type silicon substrate 1 having resistivity $\rho = 25$ to 50 $\Omega \cdot$cm, n$^+$-type buried region 2 is formed in accordance with a normal bipolar process, and n-type silicon layer 3 is epitaxially grown on substrate 1. Layer 3 has a resistivity of $t_{VG}$ 5 to 6 $\Omega \cdot$cm and a thickness of 10 to 12 $\mu$m. Note that reference symbol VG means Vapor Growth. Subsequently, 600 nm-thick thermal oxide film 4 is formed on layer 3, and an opening is formed on a prospective formation region for an isolation diffusion region of film 4. Undoped polycrystalline silicon layers 5a and 5b having a thickness of 80 nm are formed on the entire front and rear surfaces of the wafer by a Low Pressure Chemical Vapor Deposition Method (LPCVD Method).

Then, boron fluoride $BF_2$ 6 is ion-implanted into polycrystalline silicon layer 5a covering the front surface of the wafer under the conditions of an acceleration voltage of 40 keV and a dose of $4 \times 10^{15}$/cm$^2$ (FIG. 1). Note that ion-implanted molecules of boron fluoride $BF_2$ 6 are distributed throughout layer 5.

(2) Then, an $SiO_2$ film 7 having a thickness of 400 nm covering layer 5a is deposited by the CVD method.

Figure 2:
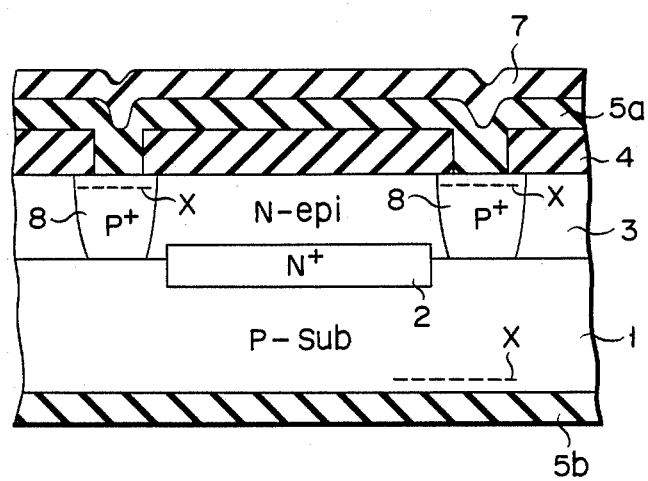

Subsequently, by performing annealing in an $N_2$ atmosphere at 1,200° C. for 4 hours, boron is thermally diffused in layer 3 using layer 5a doped with an impurity as a diffusion source, and $P^+$-type isolation diffusion region 8 which reaches substrate 1 is formed (FIG. 2).

(3) Then, after film 7 covering layer 5a is removed in a diluted hydrofluoric acid HF solution, the resultant structure is oxidized in a dry oxide $O_2$ atmosphere at 1,150° C. for 1 hour to convert the entire surfaces of layers 5a and 5b on the front and rear surfaces of the wafer into oxide films 9a and 9b. During oxidation, portions of surfaces of layers 1 and 3 directly contacting layers 5a and 5b are oxidized to some extent. That is, at the portions where layers 5a and 5b and layers 1 and 3 directly contact each other, the position of an $SiO_2/Si$ interface is deviated to position x in layers 1 and 3 (FIG. 2).

Figure 3:
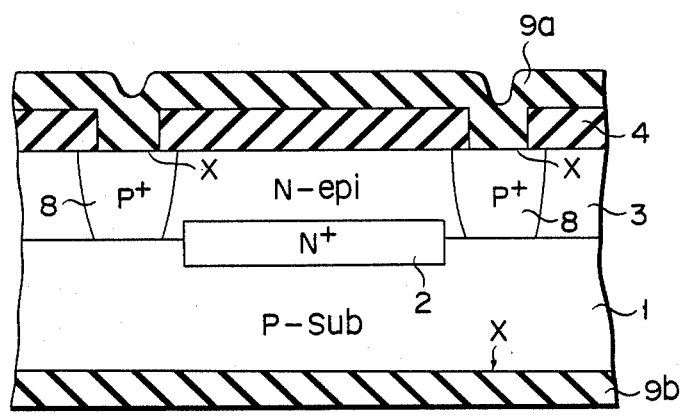
Figure 5:
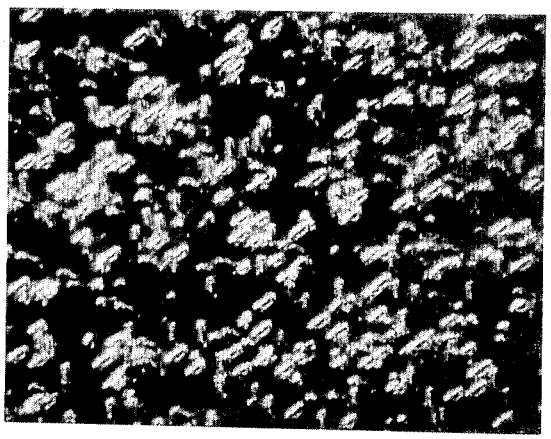
FIG. 5 is a microscopic photograph of a crystal defect on the surface of the monocrystalline silicon layer after the oxide film is removed during the manufacturing steps of the bipolar semiconductor device shown in FIG. 4.

As described above, portions of the surfaces of layers 1 and 3 are oxidized from surfaces of layers 5a and 5b to form a plurality of crystal defects in layers 1 and 3 below films 9a and 9b formed as shown in FIG. 3. Note that the defect density is $5 \times 10^4$ /mm$^2$. FIG. 5 is a microscopic photograph (a magnification of 800 times) of the surfaces of layers 1 and 3 from which films 9a and 9b are removed. Judging from the photograph, the crystal defect is mainly a stacking defect. Defect density generated using a conventional implagetter method is $1 \times 10^4$ /mm$^2$ in the case of Si ion-implantation at a dose of $1 \times 10^{15}$ /mm$^2$. Since the number of stacking defects can be an index, although it does not represent all features of the getter site, the above fact indicates that an excellent gettering effect can be obtained.

Figure 6:
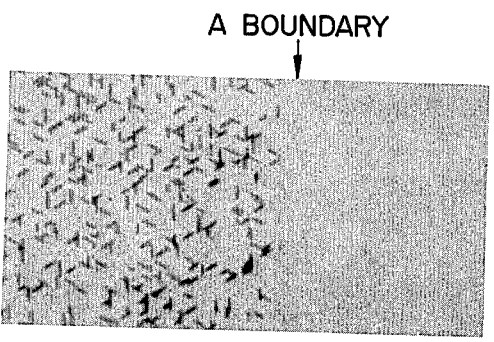
FIG. 6 is a microscopic photograph of a boundary of the isolation diffusion region of the surface of the epitaxial silicon layer after the oxidation step in the manufacturing steps of the bipolar semiconductor device.
Figure 7:
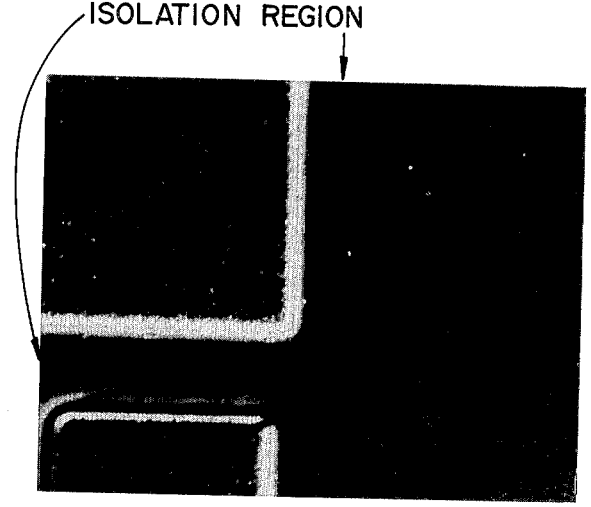
FIG. 7 is a microscopic photograph of a crystal defect formed by a conventional implagetter method.

FIG. 6 is a microscopic photograph (a magnification of 800 times) showing a boundary of isolation region 8 in the surface of layer 3 in the above oxidation step. In this case, the defect looks different from that in FIG. 5 because it is photographed without deflection. As is apparent from the photograph, no defect is formed at a portion covered with film 4.

Thus, the defect does not extend to the surrounding region, unlike the conventional implagetter method. This is because when layers 5a and 5b are oxidized, the defect to be a getter site is formed by thermal oxidation, and at the same time, gettering progresses in this step of oxidizing layers 5a and 5b. That is, as a result of the simultaneous progress of forming a getter site and gettering in a thermal equilibrium state, the generated defect immediately getters a heavy metal and stabilizes it, and no strain energy is left to allow the defect to extend to the surrounding region.

As described above, the fact that the crystal defect does not extend to the element region together with the gettering effect indicates that the characteristics of the transistor formed in the element region can be significantly improved.

Figure 4:
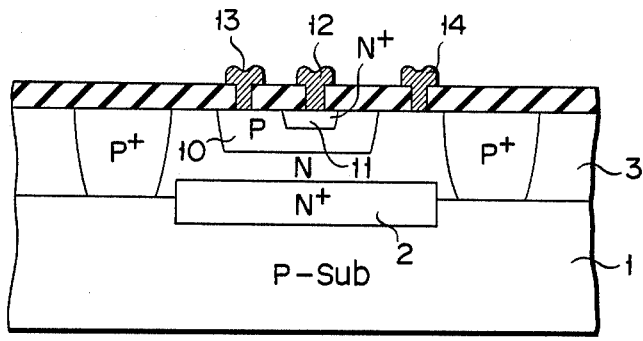
Figure 8:
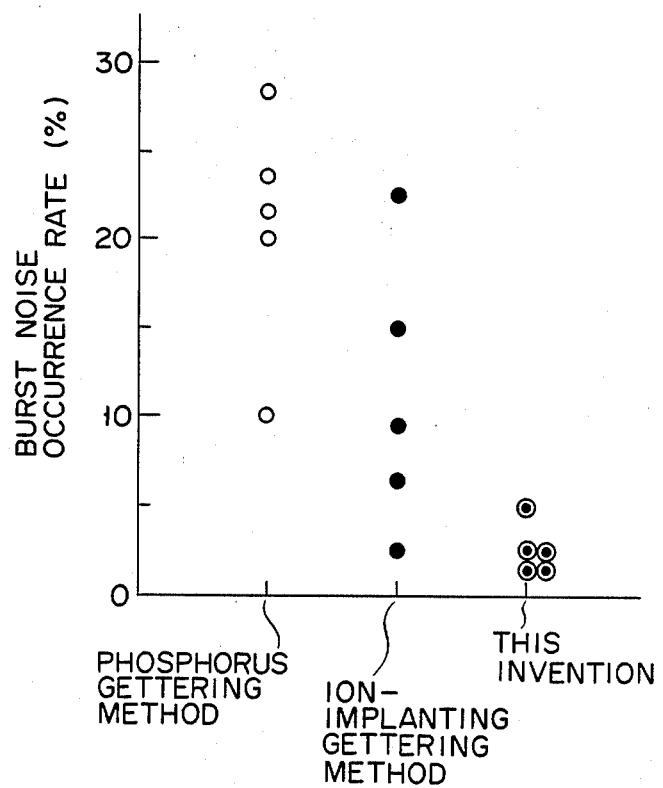
FIG. 8 is a graph for comparing a generation ratio of burst noise in the bipolar transistor obtained through the manufacturing process of the method of manufacturing a semiconductor device according to the present invention shown in FIGS. 1 to 4 with that in the bipolar transistor obtained by the conventional manufacturing method.

(4) Then, oxide films 4, 9a, and 9b are removed, and an NPN transistor is formed in the element region in accordance with a normal manufacturing process of a bipolar semiconductor device (FIG. 4). In FIG. 4, reference numeral 10 denotes a p-type base region; 11, an $n^+$-type emitter region; 12, an emitter electrode; 13, a base electrode; 14, a collector electrode; and 15, a CVD-$SiO_2$ film as an insulating interlayer. A burst noise generation ratio of the bipolar semiconductor device obtained in the above embodiment is compared with that of the bipolar semiconductor device manufactured in the same way but using a conventional phosphorus getter method or an implagetter method in units of lots, and the result is obtained as shown in FIG. 8. As is apparent from this result, the burst noise generation ratio of the bipolar transistor manufactured by the above embodiment is significantly improved. As has been described, since the burst noise is affected by the concentration of a heavy metal in the active element region, this result indicates that effective gettering is performed during the manufacturing steps of the above embodiment.

Note that a polycrystalline silicon layer doped with an impurity is used in the above embodiment to simultaneously perform formation of an isolation diffusion layer, but an undoped polycrystalline silicon layer may be thermally oxidized to obtain the same result.

In addition, polycrystalline silicon layers 5a and 5b may be oxidized in an $N_2/O_2$ mixture atmosphere to simultaneously perform diffusion of an impurity and oxidation of a polycrystalline silicon layer.

What is claimed is:

1. A method of gettering a semiconductor device, comprising the steps of:
    forming a thermal oxide film on a surface of a monocrystalline silicon layer;
    etching a predetermined position of said thermal oxide film to form an opening exposing said monocrystalline silicon layer;
    forming a polycrystalline silicon layer on said oxide film and an exposed surface of said monocrystalline silicon layer;
    ion-implanting an impurity into said polycrystalline silicon layer; and
    converting said polycrystalline silicon layer into an oxide film by thermal oxidation, said converting step also oxidizing a surface of said monocrystalline silicon layer contacting said polycrystalline silicon layer, said oxidized surface of said monocrystalline silicon layer forming a getter site.

2. A method according to claim 1, wherein said impurity is boron fluoride.

3. A method according to claim 1, wherein an $SiO_2$ film is formed on said polycrystalline silicon layer after the step of ion implanting said impurity into said polycrystalline silicon layer.

4. A method according to claim 1, wherein a polycrystalline silicon layer is also formed on a rear surface of said monocrystalline silicon layer in the step of forming said polycrystalline silicon layer.

5. A method according to claim 1, wherein the step of converting said polycrystalline silicon layer into an oxide film by thermally oxidation is performed in a dry oxygen atmosphere.

6. A method according to claim 1, wherein said impurity ion-implanted in said polycrystalline silicon layer is diffused from a portion of said monocrystalline silicon layer directly contacting said polycrystalline silicon layer into said monocrystalline silicon layer, and a portion of said monocrystalline silicon layer immediately below said opening serves as an isolation diffusion region of a bipolar transistor.

7. A method according to claim 1, wherein oxidation of said polycrystalline silicon layer and diffusion of said impurity into said monocrystalline silicon layer are simultaneously performed.

8. A method according to claim 2, wherein an $SiO_2$ film is formed on said polycrystalline silicon layer after the step of ion-implanting said impurity into said polycrystalline silicon layer.

9. A method to claim 3, wherein annealing is performed after said SiO$_2$ film is formed on said polycrystalline silicon layer so that said impurity ion-implanted in said polycrystalline silicon layer is diffused from a portion of said monocrystalline silicon layer directly contacting said polycrystalline silicon layer into said monocrystalline silicon layer.

10. A method according to claim 3, wherein the step of converting said polycrystalline silicon layer into an oxide film is performed after said SiO$_2$ film is removed.

11. A method according to claim 3, wherein said impurity ion-implanted in said polycrystalline silicon layer is diffused from a portion of said monocrystalline silicon layer directly contacting said polycrystalline silicon layer into said monocrystalline silicon layer, and a portion of said monocrystalline silicon layer immediately below said opening serves as an isolation diffusion region of a bipolar transistor.

12. A method according to claim 3, wherein oxidation of said polycrystalline silicon layer and diffusion of said impurity into said monocrystalline silicon layer are simultaneously performed.

13. A method according to claim 8, wherein annealing is performed after said SiO$_2$ film is formed on said polycrystalline silicon film so that said impurity ion-implanted in said polycrystalline silicon layer is diffused from a portion of said monocrystalline silicon layer directly contacting said polycrystalline silicon layer into said monocrystalline silicon layer.

14. A method according to claim 8, wherein the step of converting said polycrystalline silicon layer into an oxide film is performed after said SiO$_2$ film is removed.

15. A method according to claim 13, wherein said impurity ion-implanted in said polycrystalline silicon layer is diffused from a portion of said monocrystalline silicon layer directly contacting said polycrystalline silicon layer into said monocrystalline silicon layer, and a portion of said monocrystalline silicon layer immediately below said opening serves as an isolation diffusion region of a bipolar transistor.

16. A method according to claim 9, wherein said impurity ion-implanted in said polycrystalline silicon layer is diffused from a portion of said monocrystalline silicon layer directly contacting said polycrystalline silicon layer into said monocrystalline silicon layer, and a portion of said monocrystalline silicon layer immediately below said opening serves as an isolation diffusion region of a bipolar transistor.

17. A method according to claim 9, wherein oxidation of said polycrystalline silicon layer and diffusion of said impurity into said monocrystalline silicon layer are simultaneously performed.

18. A method according to claim 13, wherein oxidation of said polycrystalline silicon layer and diffusion of said impurity into said monocrystalline silicon layer are simultaneously performed.

* * * * *